United States Patent
Vogt

(10) Patent No.: US 7,143,951 B2
(45) Date of Patent: Dec. 5, 2006

(54) TRANSPONDER LABEL

(75) Inventor: Werner Vogt, Remetschwil (CH)

(73) Assignee: Interlock AG, Schlieren (CH)

(*) Notice: Subject to any disclaimer, the term of this patent is extended or adjusted under 35 U.S.C. 154(b) by 114 days.

(21) Appl. No.: 10/497,226

(22) PCT Filed: Nov. 29, 2002

(86) PCT No.: PCT/IB02/05015

§ 371 (c)(1),
(2), (4) Date: Sep. 28, 2004

(87) PCT Pub. No.: WO03/046828

PCT Pub. Date: Jun. 5, 2003

(65) Prior Publication Data

US 2005/0174240 A1 Aug. 11, 2005

(30) Foreign Application Priority Data

Nov. 29, 2001 (DE) .......................... 201 19 356 U
May 27, 2002 (DE) .......................... 202 08 277 U

(51) Int. Cl.
G06K 19/06 (2006.01)

(52) U.S. Cl. .................. 235/492; 235/488; 235/489; 235/490

(58) Field of Classification Search ............... 235/492, 235/488–490; 257/679
See application file for complete search history.

(56) References Cited

U.S. PATENT DOCUMENTS

| | | | | |
|---|---|---|---|---|
| 4,417,413 A * | 11/1983 | Hoppe et al. | .................. | 40/630 |
| 4,792,843 A * | 12/1988 | Haghiri-Tehrani et al. | .. | 257/679 |
| 4,947,531 A * | 8/1990 | Brisson | ........................ | 29/446 |
| 5,013,900 A * | 5/1991 | Hoppe | ......................... | 235/492 |
| 5,203,078 A * | 4/1993 | Nakanishi et al. | ............ | 29/843 |
| 5,497,140 A * | 3/1996 | Tuttle | ........................ | 340/10.1 |
| 6,019,865 A * | 2/2000 | Palmer et al. | .............. | 156/265 |
| 6,031,459 A * | 2/2000 | Lake | ........................ | 340/572.8 |
| 6,045,652 A * | 4/2000 | Tuttle et al. | ................ | 156/292 |
| 6,077,106 A * | 6/2000 | Mish | ........................ | 439/500 |
| 6,100,804 A * | 8/2000 | Brady et al. | ............. | 340/572.7 |
| 6,163,260 A * | 12/2000 | Conwell et al. | ......... | 340/572.8 |
| 6,395,373 B1 * | 5/2002 | Conti et al. | ................ | 428/138 |
| 6,478,229 B1 * | 11/2002 | Epstein | ...................... | 235/492 |
| 6,648,232 B1 * | 11/2003 | Emmert | ..................... | 235/488 |
| 6,923,378 B1 * | 8/2005 | Jones et al. | ................ | 235/488 |
| 2006/0027667 A1 * | 2/2006 | Jones et al. | ................ | 235/492 |

FOREIGN PATENT DOCUMENTS

| | | |
|---|---|---|
| DE | 198 47 194 | 4/2000 |
| DE | 199 46 254 | 4/2001 |
| DE | 100 45 196 | 3/2002 |
| JP | 11250218 | 9/1999 |
| WO | WO 00/30031 | 5/2000 |

* cited by examiner

*Primary Examiner*—Kimberly D. Nguyen
(74) *Attorney, Agent, or Firm*—Klaus P. Stoffel; Wolff & Samson PC

(57) ABSTRACT

A transponder label including a transponder film, a chip mounted on the transponder film and an adhesive layer. The adhesive layer has a thickness that is equal to the thickness of the chip. The adhesive layer also has a recess in an area of the chip, which recess has a contour that matches the shape of the chip.

21 Claims, 2 Drawing Sheets

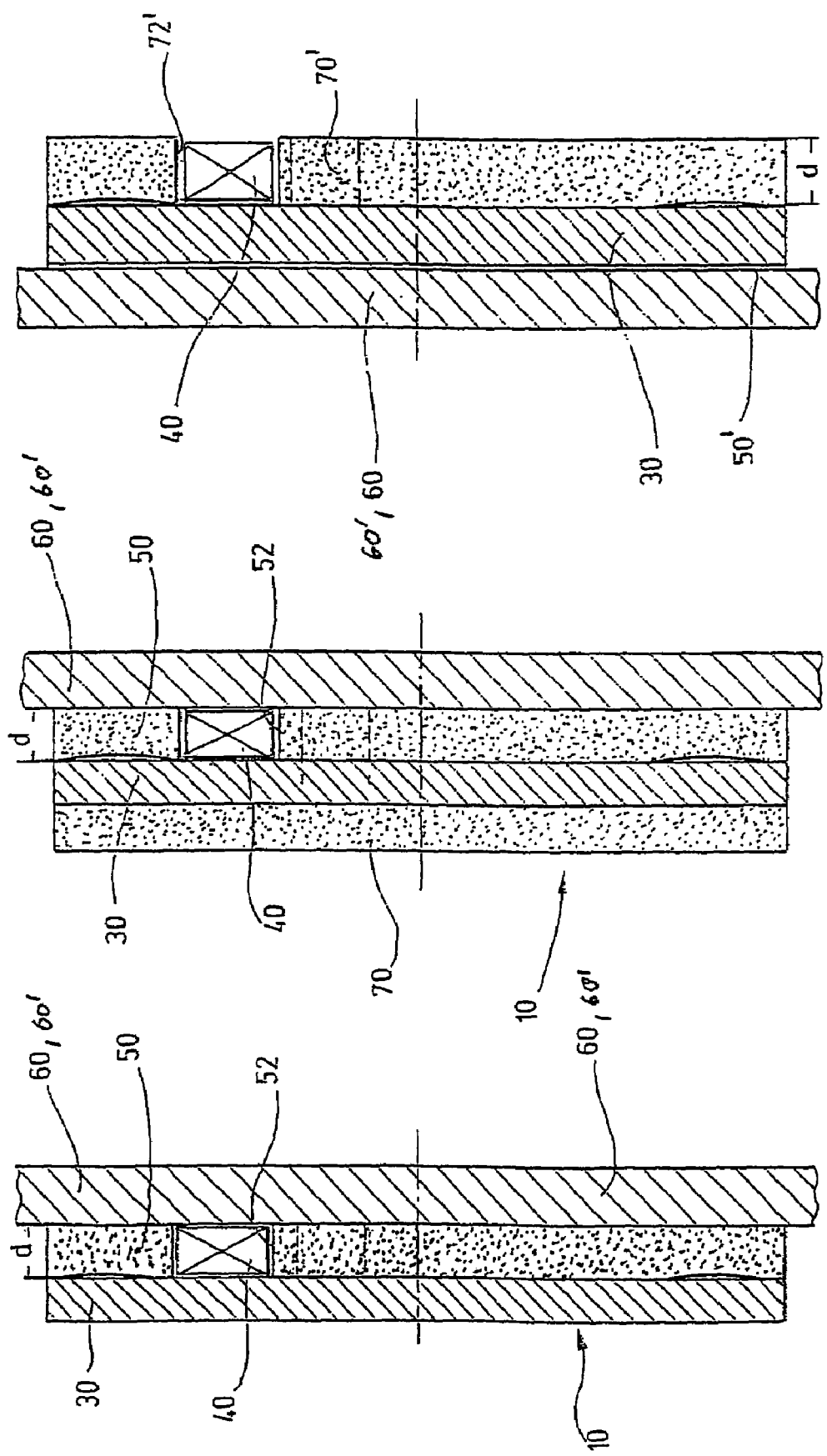

TRANSPONDER LABEL

PRIORITY CLAIM

This is a U.S. national stage of application No. PCT/IB02/05015, filed on Nov. 29, 2002. Priority is claimed on that application and on the following application: Country: Germany, Application No.: 201 19 356.6, Filed: Nov. 29, 2001; and Germany, Application No.: 202 08 277.6, Filed: May 27, 2002.

BACKGROUND OF THE INVENTION

The invention concerns a transponder label.

Transponder labels are used to label objects.

Transponders are passive electronic chips designed without a power supply, which are electromagnetically energized by a transponder reader and transmit stored information electromagnetically. Transponder chips have a flat design with small dimensions, which makes it possible to place them inside labels.

In many cases, transponder labels are designed in such a way that they can be printed before or after they have been applied to the object to be labeled.

During the printing operation, for example, with a thermotransfer printer, any protrusion of the chip causes problems. Specifically, even a very slight protrusion of the chip causes the printer head to be lifted slightly from the label in the area of the chip, so that unprinted surfaces on the transponder label can occur in the area of the chip. Therefore, transponder labels should have a surface that is as flat as possible without any areas that protrude even slightly.

DE 200 18 648 U1 discloses a transponder label with a printable upper film and a chip insert, which contains an electronic transponder chip in an elevation, and with a backing sheet that can be pulled off an adhesive layer on the underside. This transponder label is characterized by the fact that the chip insert is connected with an intermediate layer on its side that has the elevation. This intermediate layer has a recess in the area of the elevation, and the depth of the recess is at least approximately equal to the height of the elevation. As a result of the transponder chip being placed in the elevation and as a result of the intermediate layer, which is placed between the upper film and the carrier, being adapted to the elevation, a virtually flat, printable surface of the transponder label is obtained.

A disadvantage of this transponder label is its expensive assembly. Thus, it is not only necessary to place the transponder chip in an elevation specifically provided for this purpose, but it is also necessary to adapt the intermediate layer to this elevation. In addition, the elevation and the intermediate layer have a thickness that conflicts with the requirement for a very flat design of the transponder label, i.e., with the requirement that the applied transponder label not have any interfering protrusions.

SUMMARY OF THE INVENTION

The objective of the invention is to further develop a transponder label of the general type described above in such a way that it has a simple structure that is thin and as flat as possible, in which there are no protruding areas, especially in the vicinity of the chip.

An especially advantageous feature is that the transponder labels of the invention have only two layers, namely, a transponder film with a chip mounted on it and, in a first embodiment of the invention, an adhesive layer or, in a second embodiment of the invention, a cover layer. Either in the case of an adhesive layer or a cover layer, this layer has a recess in the area of the chip, and this recess has at least the same thickness as the chip. This eliminates the need for any additional intermediate layers, for in one case the adhesive layer itself to some extent constitutes this intermediate layer, while in the case of the other embodiment of the invention, the printable cover layer constitutes the intermediate layer.

This two-layer structure makes it possible to produce extremely flat transponder labels with a simple structure, which, due to the recess in the adhesive layer or cover layer, which recess is adapted to the chip, have no elevation whatsoever on their upper sides and are thus optimally printable.

In principle, the recess may have any desired shape. In particular, it may be formed simply by punching out a more or less circular hole. Advantageous embodiments provide that the contour of the recess matches the shape of the chip, so that no cavities are created in the vicinity of the chip.

If, as in the case of the first embodiment of the invention mentioned above, the chip is embedded to some extent in the adhesive layer and is held on a backing by this adhesive layer, it is possible for the transponder film to be provided with a printable cover layer on its side facing away from the chip. Both in the first embodiment and in the second embodiment of the invention, the cover layer can be designed as a printable cover film, which is very advantageous especially with respect to the flat design of the transponder label and, in addition, is easy to handle.

In an especially advantageous embodiment, especially for use in conjunction with CD-ROMS, recesses or holes are provided, e.g., by punching them out, in the transponder film and/or the cover layer and/or the adhesive film for the purpose of balancing the weight.

Another advantageous embodiment provides for a transponder film made of an opaque material.

In addition, it can also be advantageous for the transponder film itself to be formed as a cover layer and, if necessary, to be printed on its side facing away from the chip.

Before the transponder labels are adhesively attached to the carrier to be labeled, a backing layer, for example, a silicone-treated paper, is pulled off.

The transponder labels are self-adhesive transponder labels, which can be adhesively attached to a carrier, for example, an object, a CD-ROM or the like.

A different embodiment of a transponder label that is not self-adhesive provides that the carrier itself is a thin layer, for example, another printable cover film or cover layer.

A transponder label of this type may, for example, have the form of a credit card, chip card, or the like and in this way can be used, for example, for access authorization and the like.

Further advantages and features of the invention are described below with reference to the embodiments illustrated in the drawings.

BRIEF DESCRIPTION OF THE DRAWING

FIG. 2 shows a sectional side view of a first embodiment of a transponder label of the invention.

FIG. 3 shows a sectional side view of a second embodiment of the transponder label of FIG. 1.

FIG. 4 shows a sectional side view of another embodiment of a transponder label of the invention.

DETAILED DESCRIPTION OF THE INVENTION

Figure 1:
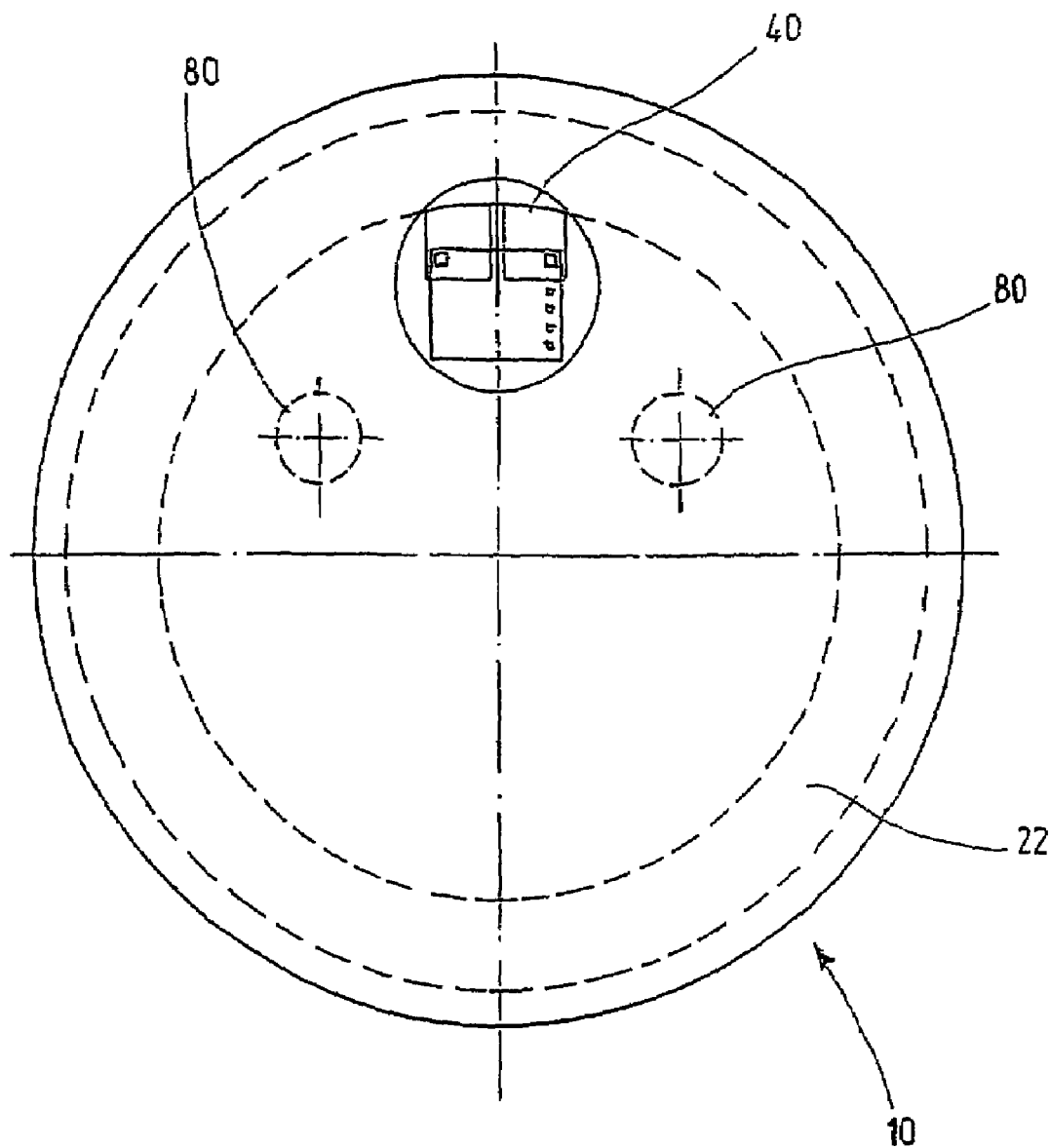
FIG. 1 shows a top view of a transponder label.

A transponder label 10 has, for example, a circular shape, as shown in FIG. 1. A chip 40 and an antenna 22 are mounted on the transponder label 10.

The layered structure of the transponder label 10 is shown schematically in FIG. 2.

The chip 40 is mounted on a transponder film 30 and is embedded to a certain extent in an adhesive layer 50, which can be designed, for example, as an adhesive film and has a thickness d that is at least as great as the thickness of the chip 40. In the area of the chip 40, the adhesive layer 50 has a recess 52, and it can be advantageous for the contour of the recess to match the shape of the chip 40.

The transponder film 30 can be designed as a cover film at the same time and, if necessary, can be printed on its side that faces away from the chip 40.

In another embodiment, which is illustrated in FIG. 3, elements that are identical to those of the first embodiment described above with reference to FIGS. 1 and 2 are labeled with the same reference numbers, so that a complete description of these elements can be obtained by referring to the above description of the first embodiment. This embodiment differs from the first embodiment in that an additional cover layer is provided in the form of a cover film 70, which can be printed if necessary.

In another transponder label of the invention, which is shown in FIG. 4, those elements that are identical to those of the transponder label described above with reference to FIGS. 1 and 2, are again labeled with the same reference numbers, so that a complete description of these elements can be obtained by referring to the above description of the first and second embodiments.

However, in contrast to the transponder labels described above in connection with FIGS. 1 and 2 and the transponder label described in connection with FIG. 3, in the transponder label illustrated in FIG. 4, the layered structure is to some extent reversed. The chip 40 is uncovered on the outside, which is possible without any problems, since its connections are mounted on its side that faces the transponder film 30 and are designed and bonded, for example, with flip-chip technology. The chip 40 itself is embedded in a cover layer 70', whose thickness d' is at least as great as the thickness of the chip 40 and which can be printed if necessary.

In the area of the chip 40, the cover layer 70' has a recess 72', whose shape matches the contour of the chip 40 or can be circularly formed in a simple way, for example, by punching it out or the like.

In this transponder label, an adhesive layer 50' is applied on the side of the transponder film 30 that faces away from the chip 40, for example, in the form of a very thin adhesive film, as shown in FIG. 4, by means of which the transponder label can be adhesively attached to the carrier 60.

Before the labels described above are adhesively attached to a carrier that is to be labeled, a backing layer, for example, a silicone-treated paper, must be pulled off.

The transponder labels described above are self-adhesive transponder labels, but it is also possible to produce labels that are not self-adhesive. In this case, the labels are not adhesively attached to a carrier 60, but rather the carrier 60 is formed by a layer 6', which, for example, is designed like the transponder film 30 or, as in the case of the embodiment described in connection with FIG. 3, like the film 70. A transponder label of this type that is not self-adhesive can take the form of, for example, a credit card, chip card, or any other desired form and can thus be used, for example, as an access authorization card. The transponder film 30 and/or the cover layer 70, 70' and/or the adhesive layer 50 have recesses for balancing weight.

The invention claimed is:

1. A transponder label, comprising: a transponder film; a chip mounted on the transponder film; and an adhesive layer, the adhesive layer having a thickness that is equal to the thickness of the chip, the adhesive layer having a recess in an area of the chip, the recess having a contour that matches a shape of the chip.

2. The transponder label in accordance with claim 1, and further comprising a printable cover layer on a side of the transponder film that faces away from the chip.

3. The transponder label according to claim 2, wherein at least one of the group consisting of the transponder film, the cover layer and the adhesive layer has recesses for balancing weight.

4. The transponder label in accordance with claim 2, and further comprising another cover layer joined to the adhesive layer.

5. The transponder label in accordance with claim 4, wherein the label is shaped as a credit card or chip card.

6. The transponder label in accordance with claim 1, wherein the transponder film consists of an opaque material.

7. The transponder label in accordance with claim 1, wherein the transponder film is a cover film.

8. The transponder label in accordance with claim 7, wherein the transponder film is printable on a side that faces away from the chip.

9. The transponder label in accordance with claim 1, wherein the adhesive layer is covered by a backing layer which can be pulled off.

10. The transponder label in accordance with claim 9, wherein the backing layer is silicone-treated paper.

11. A transponder label, comprising: a transponder film; a chip mounted on the transponder film; an adhesive layer; and a printable cover layer, the adhesive layer being mounted on a side of the transponder film that faces away from the chip, the chip being embedded in the cover layer, the cover layer having a thickness equal to a thickness of the chip and a recess in an area of the chip.

12. The transponder label in accordance with claim 11, wherein the recess has a contour that matches a shape of the chip.

13. The transponder label in accordance with claim 11, wherein the cover layer is a printable cover film.

14. The transponder label in accordance with claim 11, wherein at least one of the group consisting of the transponder film, the cover layer and the adhesive layer has recesses for balancing weight.

15. The transponder label in accordance with claim 11, wherein the transponder film consists of an opaque material.

16. The transponder label in accordance with claim 11, wherein the transponder film is a cover film.

17. The transponder label in accordance with claim 16, wherein the transponder film is printable on a side that faces away from the chip.

18. The transponder label in accordance with claim 11, wherein the adhesive layer is covered by a backing layer which can be pulled off.

19. The transponder label in accordance with claim 18, wherein the backing layer is silicone-treated paper.

20. The transponder label in accordance with claim 11, and further comprising another cover layer joined to the adhesive layer.

21. The transponder label in accordance with claim 20, wherein the label is shaped as a credit card or chip card.

* * * * *